United States Patent
Fekih-Romdhane (10) Patent No.: US 7,773,438 B2
(45) Date of Patent: Aug. 10, 2010

(54) INTEGRATED CIRCUIT THAT STORES FIRST AND SECOND DEFECTIVE MEMORY CELL ADDRESSES

(75) Inventor: Khaled Fekih-Romdhane, Burlington, VT (US)

(73) Assignee: Qimonda North America Corp., Cary, NC (US)

( * ) Notice: Subject to any disclaimer, the term of this patent is extended or adjusted under 35 U.S.C. 154(b) by 201 days.

(21) Appl. No.: 12/134,485

(22) Filed: Jun. 6, 2008

(65) Prior Publication Data

US 2009/0303813 A1 Dec. 10, 2009

(51) Int. Cl.
G11C 7/00 (2006.01)
(52) U.S. Cl. .............. 365/200; 365/230.03; 365/185.11
(58) Field of Classification Search ................. 365/200, 365/189.05, 230.03, 185.11
See application file for complete search history.

(56) References Cited

U.S. PATENT DOCUMENTS

| | | | |
|---|---|---|---|
| 5,764,655 A | 6/1998 | Kirihata et al. | |
| 6,310,807 B1 * | 10/2001 | Ooishi et al. | 365/200 |
| 6,650,578 B2 * | 11/2003 | Kojima et al. | 365/200 |
| 6,768,694 B2 | 7/2004 | Anand et al. | |
| 6,769,081 B1 | 7/2004 | Parulkar | |
| 6,845,043 B2 * | 1/2005 | Dono | 365/185.22 |
| 6,856,569 B2 | 2/2005 | Nelson et al. | |
| 6,888,764 B2 * | 5/2005 | Shiga et al. | 365/200 |
| 6,922,649 B2 | 7/2005 | Mondahl et al. | |
| 6,928,377 B2 | 8/2005 | Eustis et al. | |
| 7,053,470 B1 | 5/2006 | Sellers et al. | |
| 7,254,078 B1 | 8/2007 | Park et al. | |
| 2007/0047347 A1 | 3/2007 | Byun et al. | |
| 2007/0079052 A1 | 4/2007 | Hasegawa et al. | |

* cited by examiner

*Primary Examiner*—Son Dinh
(74) *Attorney, Agent, or Firm*—Dicke, Billig & Czaja P.L.L.C.

(57) ABSTRACT

An integrated circuit including an array of memory cells, volatile storage, non-volatile storage and a circuit. The circuit is configured to sense first addresses of first defective memory cells from the non-volatile storage to obtain sense first addresses. The circuit detects second defective memory cells via the sense first addresses and stores second addresses of the second defective memory cells in the volatile storage and in the non-volatile storage.

25 Claims, 5 Drawing Sheets

Fig. 5 ents of the drawings are not necessarily to scale relative to each other. Like reference numerals designate corresponding similar parts.

INTEGRATED CIRCUIT THAT STORES FIRST AND SECOND DEFECTIVE MEMORY CELL ADDRESSES

BACKGROUND

Integrated circuit speeds continue to increase and the amount of data communicated between circuits continues to increase to meet the demands of system applications. As data volume increases, the industry continues to develop semiconductor memory devices having more memory to accommodate the increased data requirements. These trends of increasing circuit speeds, increasing data volume, and memory devices having more memory are expected to continue into the future.

Typically, a semiconductor memory device includes a mass-storage memory, such as a dynamic random access memory (DRAM) or a static random access memory (SRAM). The mass-storage memory includes memory cells in one or more memory cell arrays. The memory device can be one integrated circuit chip or multiple integrated circuit chips in a multi-chip package.

Often, the mass-storage memory includes redundant memory cells that can be used for repair. The mass-storage memory is tested at wafer level testing and defective memory cells are identified. The defective memory cells can be hard failures, such as stuck-at-one or stuck-at-zero failures, insufficient data retention times, or any other failure that prevents the device from operating efficiently. Laser-blown fuses on the memory device are blown to replace the defective memory cells with redundant memory cells prior to packaging.

However, during manufacturing a memory device may be harmed by contamination or stresses, such as thermal stress due to packaging, thermal stress sustained in the attachment of a packaged or unpackaged device to a substrate, high-voltage testing, and electro-static discharge. As a result, after manufacturing, the memory device may include defective memory cells that have not been repaired. In addition, the memory device may be harmed again by the customer, such as by mounting the memory device on a substrate and/or in a multi-chip package (MCP).

For these and other reasons there is a need for the present invention.

SUMMARY

One embodiment described in the disclosure provides an integrated circuit including an array of memory cells, volatile storage, non-volatile storage and a circuit. The circuit is configured to sense first addresses of first defective memory cells from the non-volatile storage to obtain sensed first addresses. The circuit detects second defective memory cells via the sensed first addresses and stores second addresses of the second defective memory cells in the volatile storage and in the non-volatile storage.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The ele-

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Figure 1:
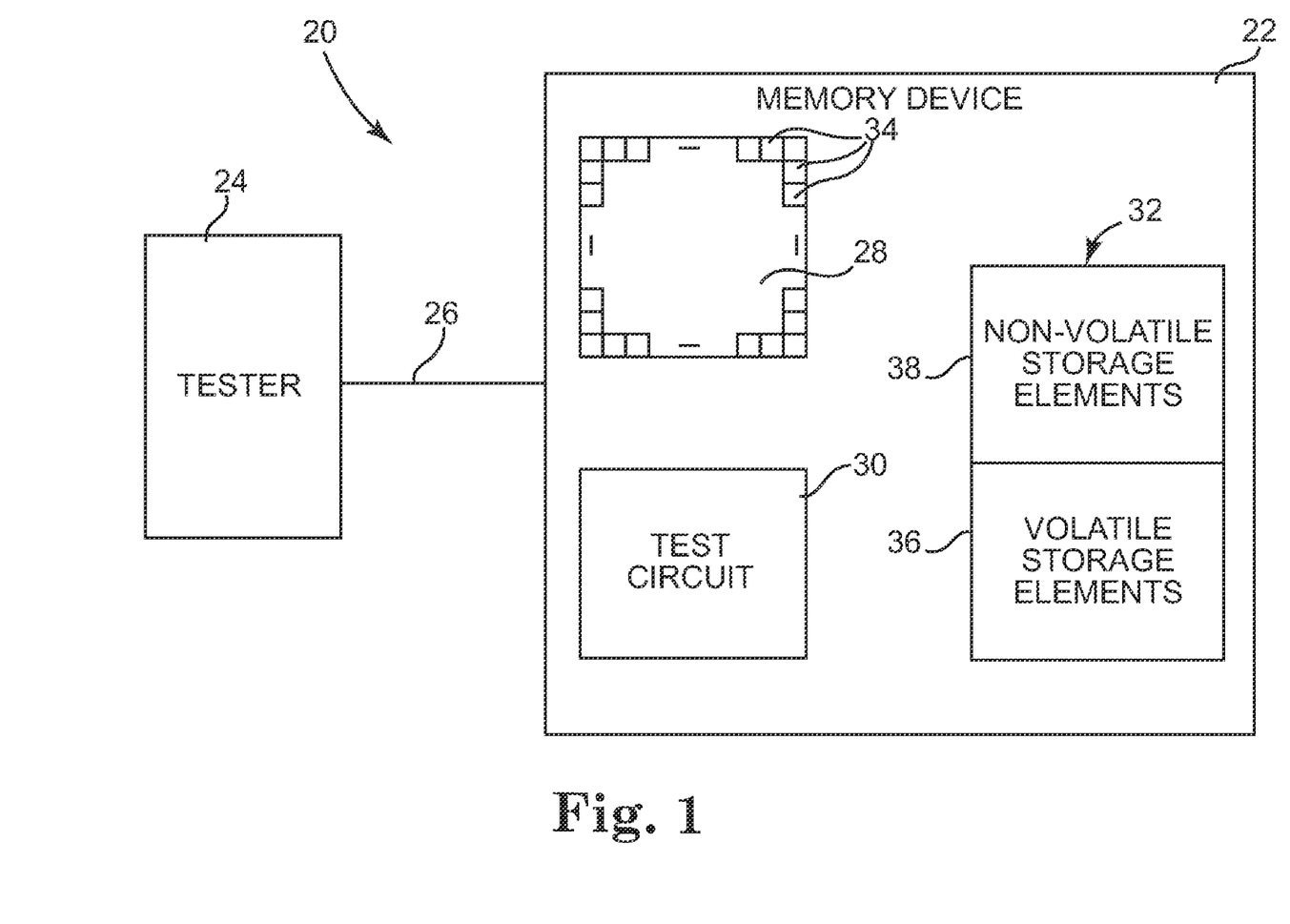
FIG. 1 is a diagram illustrating one embodiment of a system that repairs memory defects in a memory device.

FIG. 1 is a diagram illustrating one embodiment of a system 20 that repairs memory defects in memory device 22. System 20 includes memory device 22 and tester 24. Memory device 22 is electrically coupled to tester 24 via communications path 26. In one embodiment, memory device 22 is an integrated circuit on a semiconductor wafer. In one embodiment, memory device 22 is a packaged integrated circuit chip. In one embodiment, memory device 22 is a single integrated circuit chip. In one embodiment, memory device 22 includes multiple integrated circuit chips, such as multiple integrated circuit chips in a MCP.

Memory device 22 includes an array of memory cells 28, a test circuit 30 and storage elements 32. The array of memory cells 28 includes memory cells 34 in one or more banks of memory cells. Storage elements 32 include volatile storage elements 36 and hard coded or non-volatile storage elements 38. The array of memory cells 28 is tested to identify defective memory cells and obtain the addresses of the defective memory cells. The addresses of the defective memory cells are used to replace the defective memory cells with other memory cells to repair memory device 22.

At wafer level testing, the array of memory cells 28 can be tested and laser-blown fuses in memory device 22 can be blown to replace defective memory cells with other memory cells. Test circuit 30 detects defective memory cells at wafer level testing and at other times, such as at the end of the manufacturing process, after memory device 22 is received by the customer and/or after packaging memory device 22, to identify defective memory cells and replace previously un-repaired defective memory cells with other memory cells via test circuit 30.

Test circuit 30 can also repair memory device 22 multiple times. In a first or initial repair test, test circuit 30 detects failed or defective memory cells in the array of memory cells 28 and provides the addresses of the defective memory cells. Each of the addresses is compared to the addresses of defective memory cells previously repaired, such as by laser-blown fuses. If the address of a defective memory cell is different than the addresses of the previously repaired defective memory cells, the address is provided to volatile storage elements 36.

Volatile storage elements 36 receive and store the addresses of previously un-repaired defective memory cells and test circuit 30 writes the addresses from volatile storage elements 36 to non-volatile storage elements 38. The addresses of the defective memory cells are maintained in non-volatile storage elements 38 even if memory device 22 is powered down.

To repair memory device 22 another time via test circuit 30 in a second or subsequent repair test, memory device 22 is powered-up and test circuit 30 senses the addresses of the defective memory cells from non-volatile storage elements 38 to obtain sensed addresses. Test circuit 30 detects defective memory cells in the array of memory cells 28 and each address of a defective memory cell is compared to the sensed addresses and the addresses of defective memory cells previously repaired, such as by laser-blown fuses. If the address of a defective memory cell matches one of the sensed addresses or one of the other previously repaired addresses, the defective memory cell is not repaired a second time. If the address of a defective memory cell does not match one of the sensed addresses or one of the other previously repaired addresses, the address is stored in volatile storage elements 36. Later, test circuit 30 writes the addresses of the previously un-repaired defective memory cells from volatile storage elements 36 to non-volatile storage elements 38. Test circuit 30 can provide multiple repair tests, such as two or more repair tests, to repair memory device 22.

Test circuit 30 stores the addresses of previously un-repaired defective memory cells obtained via a first test in first entries in volatile storage elements 36 and test circuit 30 stores the addresses of previously un-repaired defective memory cells obtained via a second test in second entries in volatile storage elements 36, where the first entries do not physically overlap the second entries in volatile storage elements 36. Also, test circuit 30 stores the addresses of previously un-repaired defective memory cells obtained via the first test in third entries in non-volatile storage elements 38 and test circuit 30 stores addresses of previously un-repaired defective memory cells obtained via the second test in fourth entries in non-volatile storage elements 36, where the third entries do not physically overlap the fourth entries in non-volatile storage elements 38.

During or after each repair test, test circuit 30 writes or programs the addresses from volatile storage elements 36 into non-volatile storage elements 38. In one embodiment, the first entries correspond to the third entries and the second entries correspond to the fourth entries, such that the first entries are written into the third entries during or after the first test and the second entries are written into the fourth entries during or after the second test. In one embodiment, the sensed addresses are stored in the first entries in volatile storage elements 36. In one embodiment, the first entries are grayed out, also referred to as zeroed out, prior to writing the second entries into the fourth entries during or after the second test, where graying out the first entries indicates that the third entries are not to be re-blown or re-programmed since the third entries were previously programmed during or after the first test.

Each entry in the storage elements 32 includes information about defective memory cells in the array of memory cells 28. In one embodiment, each entry in volatile storage elements 36 includes one of the addresses of a defective memory cell and a volatile storage master bit that indicates the volatile storage elements that follow include the address of a defective memory cell. In one embodiment, each entry in non-volatile storage elements 38 includes one of the addresses of a defective memory cell and a non-volatile storage master bit that indicates the non-volatile storage elements that follow include the address of a defective memory cell.

In one embodiment, each entry in volatile storage elements 36 includes the row and column addresses of a defective memory cell and a volatile storage master bit that indicates the volatile storage elements that follow include the address of a defective memory cell. In one embodiment, each entry in non-volatile storage elements 38 includes the row and column addresses of a defective memory cell and a non-volatile storage master bit that indicates the non-volatile storage elements that follow include the address of a defective memory cell. In one embodiment, each entry in volatile storage elements 36 includes the row address or the column address of a defective memory cell and a volatile storage master bit that indicates the volatile storage elements that follow include the address of a defective memory cell. In one embodiment, each entry in non-volatile storage elements 38 includes the row address or the column address of a defective memory cell and a non-volatile storage master bit that indicates the non-volatile storage elements that follow include the address of a defective memory cell.

The array of memory cells 28 includes one or more banks of memory cells. In one embodiment, each entry in volatile storage elements 36 includes the bank address of a defective memory cell. In one embodiment, each entry in non-volatile storage elements 38 includes the bank address of a defective memory cell.

The storage elements 32 include separate sets of volatile storage elements 36 and separate sets of non-volatile storage elements 38. Each of the banks of memory cells is electrically coupled to a different one of the sets of volatile storage elements 36. Also, each of the sets of volatile storage elements 36 corresponds to one of the sets of non-volatile storage elements 38. In addition, each of the sets of non-volatile storage elements 38 corresponds to a different one of the banks of memory cells.

Defective memory cells are replaced with other memory cells via the addresses of the defective memory cells stored in the storage elements 32. In one embodiment, the other memory cells are redundant memory cells in the array of memory cells 28. In one embodiment, the other memory cells are redundant memory cells external to the array of memory cells 28. In one embodiment, the other memory cells are memory cells in an alternative memory. In one embodiment, memory cells 34 in the array of memory cells 28 are DRAM cells. In one embodiment, memory cells 34 in the array of memory cells 28 are SRAM cells. In one embodiment, memory cells 34 in the array of memory cells 28 are DRAM cells and memory cells in an alternative memory are SRAM cells. In one embodiment, memory cells in an alternative memory are Flash memory cells.

Memory device 22 and tester 24 communicate via communications path 26 to test and repair memory device 22. In one embodiment, memory device 22 is an integrated circuit in wafer form that is tested and repaired at wafer level testing. In one embodiment, memory device 22 is a packaged integrated circuit chip that is tested and repaired at package testing. In one embodiment, tester 24 tests the array of memory cells 28 and test circuit 30 detects defective memory cells and provides defective memory cell information. In one embodiment, memory device 22 includes a built-in-self-test (BIST) circuit that tests the array of memory cells 28 and includes test circuit 30 that detects defective memory cells and provides the defective memory cell information.

Figure 2:
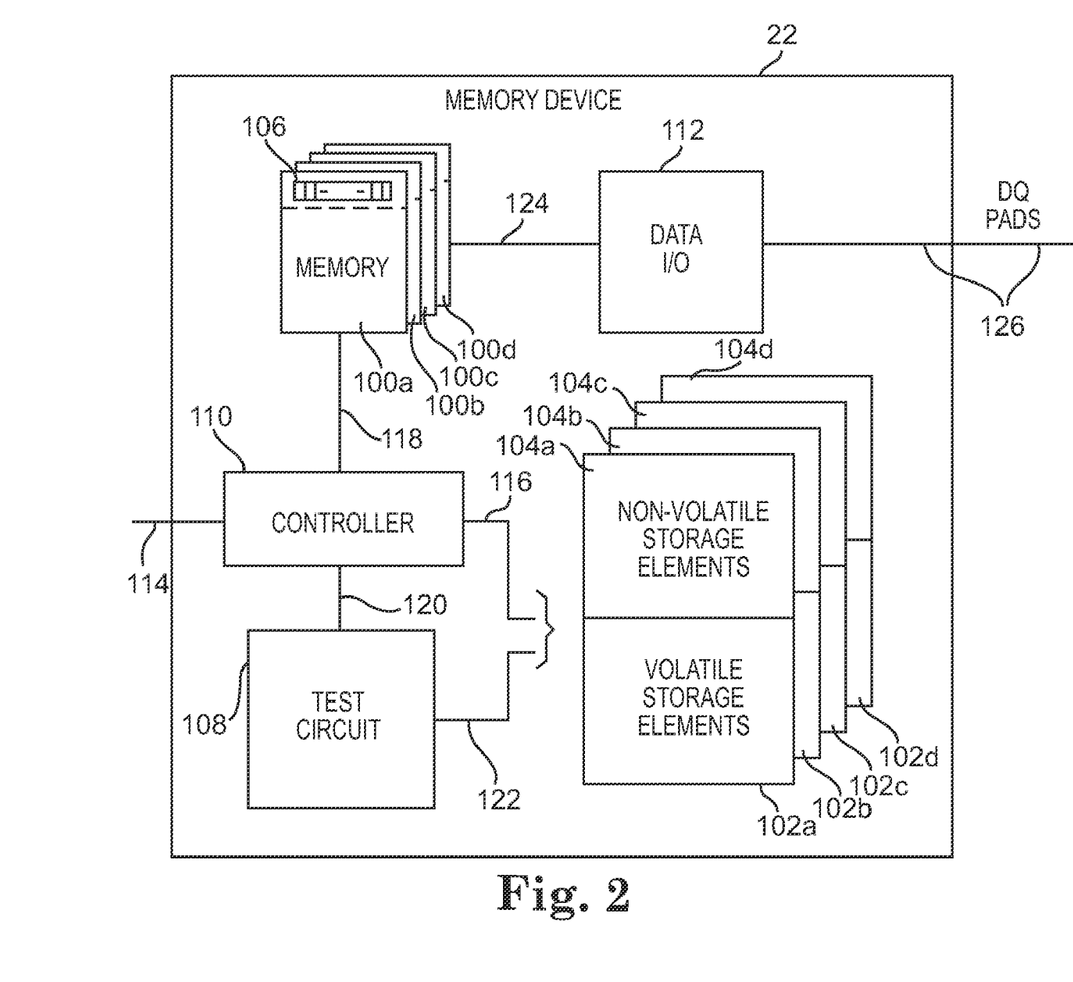
FIG. 2 is a diagram illustrating one embodiment of a memory device.

FIG. 2 is a diagram illustrating one embodiment of memory device 22 that includes four banks of memory cells 100a-100d, four sets of volatile storage elements 102a-102d and four sets of non-volatile storage elements 104a-104d. The four banks of memory cells 100a-100d are similar to the array of memory cells 28 (shown in FIG. 1). The four sets of volatile storage elements 102a-102d are similar to the volatile storage elements 36 (shown in FIG. 1) and the four sets of non-volatile storage elements 104a-104d are similar to the non-volatile storage elements 38 (shown in FIG. 1).

Each of the four banks of memory cells 100a-100d includes memory cells 34 (shown in FIG. 1) and redundant memory cells 106. Redundant memory cells 106 are used to repair defective memory cells in the four banks of memory cells 100a-100d. In one embodiment, redundant memory cells external to the four banks of memory cells 100a-100d are used to repair defective memory cells in the four banks of memory cells 100a-100d. In one embodiment, memory device 22 includes an alternative memory having alternative memory cells, where the alternative memory cells and/or redundant memory cells 106 are used to repair defective memory cells in the four banks of memory cells 100a-100d.

Each of the banks of memory cells 100a-100d is electrically coupled to a different one of the four sets of volatile storage elements 102a-102d. For example, memory bank 1 at 100a is electrically coupled to the set of volatile storage elements at 102a, memory bank 2 at 100b is electrically coupled to the set of volatile storage elements at 102b, memory bank 3 at 100c is electrically coupled to the set of volatile storage elements at 102c, and memory bank 4 at 100d is electrically coupled to the set of volatile storage elements at 102d.

Also, each of the four sets of volatile storage elements 102a-102d corresponds to one of the four sets of non-volatile storage elements 104a-104d. The set of volatile storage elements 102a corresponds to the set of non-volatile storage elements 104a, the set of volatile storage elements 102b corresponds to the set of non-volatile storage elements 104b, the set of volatile storage elements 102c corresponds to the set of non-volatile storage elements 104c, and the set of volatile storage elements 102d corresponds to the set of non-volatile storage elements 104d.

In addition, each of the sets of non-volatile storage elements 104a-104d corresponds to a different one of the banks of memory cells 100a-100d. The set of non-volatile storage elements 104a corresponds to memory bank 1 at 100a, the set of non-volatile storage elements 104b corresponds to memory bank 2 at 100b, the set of non-volatile storage elements 104c corresponds to memory bank 3 at 100c, and the set of non-volatile storage elements 104d corresponds to memory bank 4 at 100d.

In one embodiment, the volatile storage elements 102a-102d are flip-flops. In one embodiment, the volatile storage elements 102a-102d are SRAM cells. In other embodiments, the volatile storage elements 102a-102d are any suitable volatile storage elements that can be dynamically written and over-written.

In one embodiment, non-volatile storage elements 104a-104d include electrical fuses that are blown via a fuse blowing circuit (not shown). In one embodiment, non-volatile storage elements 104a-104d include Flash memory. In one embodiment, non-volatile storage elements 104a-104d include electrically programmable read only memory. In one embodiment, non-volatile storage elements 104a-104d include electrically erasable programmable read only memory.

Memory device 22 also includes a test circuit 108, a controller 110, and a data input/output (I/O) circuit 112. Test circuit 108 is similar to test circuit 30 (shown in FIG. 1).

Controller 110 receives commands and addresses via command bus 114. Controller 110 is electrically coupled to volatile storage elements 102a-102d and non-volatile storage elements 104a-104d via storage element communications path 116, to the four banks of memory cells 100a-100d via memory communications path 118, and to test circuit 108 via test circuit communications path 120. Test circuit 108 is electrically coupled to volatile storage elements 102a-102d and non-volatile storage elements 104a-104d via test communications path 122. Also, data I/O circuit 112 is electrically coupled to the four banks of memory cells 100a-100d via memory data path 124 and data I/O circuit 112 receives data from and provides data to DQ pads at 126.

Controller 110 receives test commands and addresses from tester 24 to test the four banks of memory cells 100a-100d. Controller 110 provides control signals and addresses to the four banks of memory cells 100a-100d via memory communications path 118 to write data into and read data from the four banks of memory cells 100a-100d. The four banks of memory cells 100a-100d receive write data that is internally generated from a pre-defined set of data in memory device 22 and/or write data from DQ pads at 126 and data I/O circuit 112 via memory data path 124. The four banks of memory cells 100a-100d provide read data to test circuit 108 via memory communications path 118, controller 110, and test circuit communications path 120. In one embodiment, the four banks of memory cells 100a-100d provide read data to data I/O circuit 112 via memory data path 124 and data I/O circuit 112 provides the data to DQ pads at 126.

Test circuit 108 receives internally generated expected results or expected results from tester 24. Test circuit 108 checks the received read data against the expected results to detect and identify defective memory cells. Test circuit 108 and controller 110 compare detected defective memory cell addresses to previously repaired addresses and to defective memory cell addresses already stored in the four sets of volatile storage elements 102a-102d. If a detected defective memory cell address does not match the previously repaired addresses or the defective memory cell addresses already stored in the four sets of volatile storage elements 102a-102d, the address is stored into one of the four sets of volatile storage elements 102a-102d.

Test circuit 108 provides each non-matching defective memory cell address to the one set of volatile storage elements 102a-102d that corresponds to the bank of memory cells 100a-100d that includes the defective memory cell. Controller 110 and test circuit 108 write the defective memory cell address into the set of volatile storage elements 102a-102d via test communications path 122. In one embodiment, since each of the banks of memory cells 100a-100d is electrically coupled to a different one of the sets of volatile storage elements 102a-102d, the bank address is not stored. In one embodiment, row and column addresses are stored. In one embodiment, a row address or a column address is stored. In other embodiments, bank addresses are stored along with a row address and/or a column address.

In another embodiment, memory device 22 includes a BIST circuit that includes test circuit 108. Controller 110 receives a test command from tester 24 via command bus 114 and provides a control signal to the BIST circuit, which begins testing the four banks of memory cells 100a-100d in response to the control signal. The BIST circuit provides control signals, data, and addresses to controller 110 and controller 110 provides control signals, data, and addresses to the four banks of memory cells 100a-100d via memory communications path 118. Data is written into the four banks of memory cells 100a-100d and read from the four banks of memory cells 100a-100d to test memory device 22. The four banks of memory cells 100a-100d provide read data to test circuit 108 that receives the read data from the four banks of memory cells 100a-100d and checks the received read data against expected results to detect and identify defective memory cells. Test circuit 108 and controller 110 compare detected defective memory cell addresses to previously repaired addresses and to defective memory cell addresses already stored in one of the four sets of volatile storage elements 102a-102d. If a detected defective memory cell address does not match the previously repaired addresses or the defective memory cell addresses already stored in the four sets of volatile storage elements 102a-102d, the address is stored into one of the four sets of volatile storage elements 102a-102d. Test circuit 108 writes the non-matching defective memory cell addresses into volatile storage elements 102a-102d via test communications path 122.

In any embodiment, the defective memory cell addresses in the four sets of volatile storage elements 102a-102d are programmed into the corresponding sets of non-volatile storage elements 104a-104d. Each of the four sets of non-volatile storage elements 104a-104d is programmed via the corresponding one of the sets of volatile storage elements 102a-102d. The stored addresses are used to identify and replace defective memory cells with redundant memory cells 106. In other embodiments, the stored addresses are used to identify and replace defective memory cells with one or more of redundant memory cells 106, redundant memory cells external to the four banks of memory cells 100a-100d and/or alternative memory cells from an alternative memory.

In normal operation, controller 110 receives a command and an address and compares the address to the addresses of defective memory cells stored in the four sets of non-volatile storage elements 104a-104d. If the addresses do not match, controller 110 provides control signals and addresses to the four banks of memory cells 100a-100d to read data from or write data into the four banks of memory cells 100a-100d. Data read from the four banks of memory cells 100a-100d is provided to data I/O circuit 112 via memory data path 124 and data I/O circuit 112 provides the data to DQ pads at 126. Data written into the four banks of memory cells 100a-100d is received from data I/O circuit 112 that receives the write data via DQ pads at 126. If the addresses match, controller 110 provides control signals and corresponding redundant memory cell addresses to the four banks of memory cells 100a-100d to read data from or write data into the redundant memory cells 106. Data read from redundant memory cells 106 is provided to data I/O circuit 112 via memory data path 124 and data I/O circuit 112 provides the data to DQ pads at 126. Data written into redundant memory cells 106 is received from data I/O circuit 112 that receives the write data via DQ pads at 126.

In other embodiments, if the addresses match, controller 110 provides control signals and corresponding memory cell addresses to read data from or write data into redundant memory cells that are external to the four banks of memory cells 100a-100d and/or alternative memory cells from an alternative memory.

In memory repair operations via test circuit 108, memory device 22 can be repaired one time or multiple times. In a first repair test, test circuit 108 detects defective memory cells in the four banks of memory cells 100a-100d and provides the addresses of the defective memory cells. Each of the addresses is compared to the addresses of defective memory cells previously repaired, such as by laser-blown fuses, and to defective memory cell addresses already stored in the four sets of volatile storage elements 102a-102d. If the address of a defective memory cell is different than the addresses of the previously repaired defective memory cells and the defective memory cell addresses already stored in the four sets of volatile storage elements 102a-102d, the address is stored in one of the four sets of volatile storage elements 102a-102d.

The four sets of volatile storage elements 102a-102d receive and store the addresses of previously un-repaired defective memory cells and test circuit 30 writes the addresses from the four sets of volatile storage elements 102a-102d into the corresponding sets of non-volatile storage elements 104a-104d. Each of the four sets of non-volatile storage elements 104a-104d is programmed via the corresponding one of the sets of volatile storage elements 102a-102d. The addresses of the defective memory cells are maintained in non-volatile storage elements 38 even if memory device 22 is powered down.

To repair memory device 22 again via test circuit 108 in a second or subsequent repair test, memory device 22 is powered-up and test circuit 108 senses the addresses of the defective memory cells from the four sets of non-volatile storage elements 104a-104d to obtain sensed addresses. In one embodiment, the sensed addresses are stored in the corresponding four sets of volatile storage elements 102a-102d. In one embodiment, the sensed addresses are stored in other volatile storage elements.

Test circuit 108 detects defective memory cells in the four banks of memory cells 100a-100d and each defective memory cell address is compared to the sensed addresses and to the addresses of defective memory cells previously repaired, such as by laser-blown fuses, and to defective memory cell addresses already stored in the four sets of volatile storage elements 102a-102d. If the address matches one of the sensed addresses or one of the other previously repaired addresses or one of the defective memory cell addresses already stored in the four sets of volatile storage elements 102a-102d, the defective memory cell is not repaired a second time. If the address does not match one of the sensed addresses or one of the other previously repaired addresses or one of the defective memory cell addresses already stored in the four sets of volatile storage elements 102a-102d, the address is stored in one of the four sets of volatile storage elements 102a-102d. Later, test circuit 108 writes the addresses of the previously un-repaired defective memory cells from the four sets of volatile storage elements 102a-102d into the four sets of non-volatile storage elements 104a-104d. Test circuit 108 can provide multiple repair tests, such as two or more repair tests, to repair memory device 22.

Figure 3:
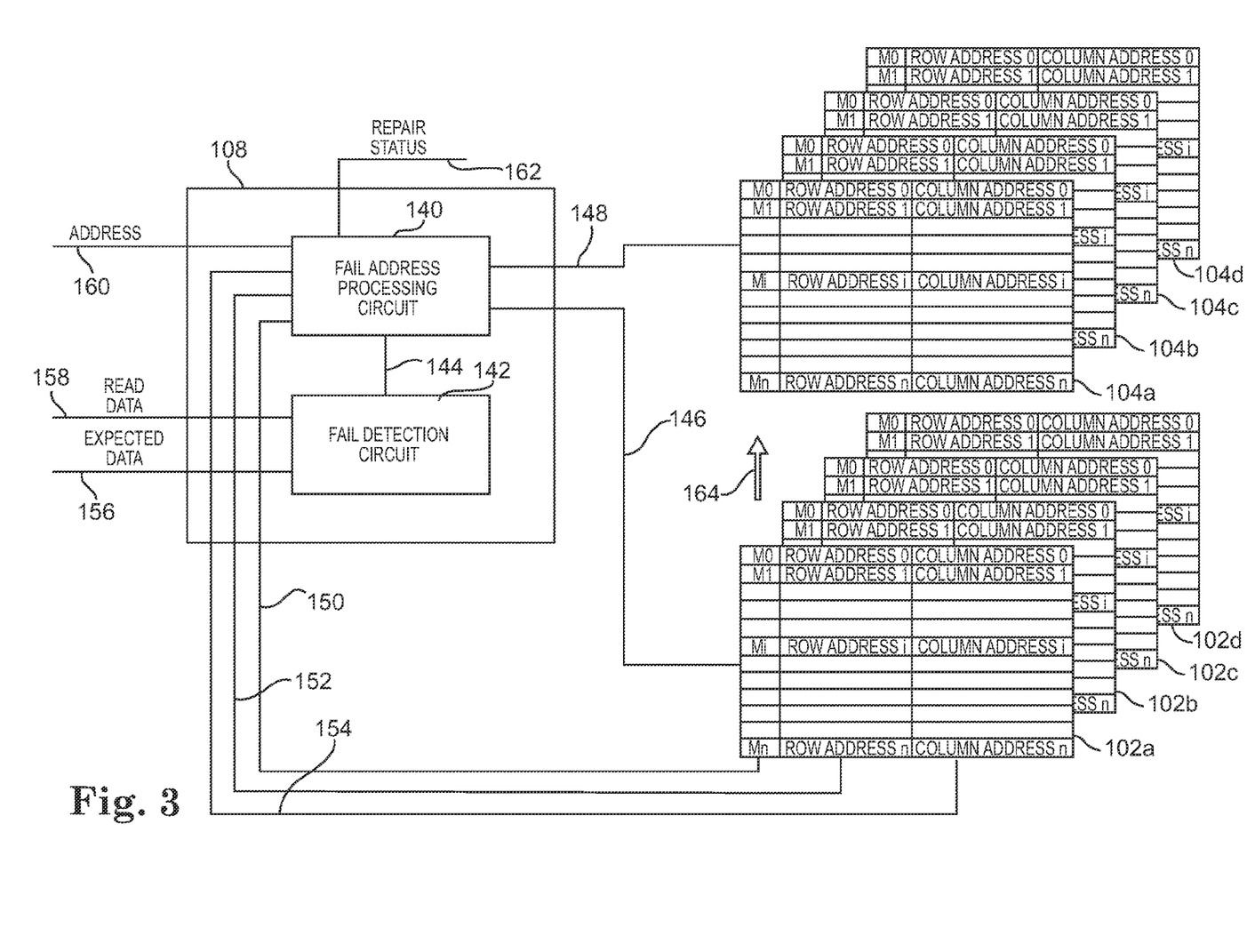
FIG. 3 is a diagram illustrating one embodiment of a test circuit, four sets of volatile storage elements and four sets of non-volatile storage elements.

FIG. 3 is a diagram illustrating one embodiment of test circuit 108, the four sets of volatile storage elements 102a-102d and the four sets of non-volatile storage elements 104a-104d. Test circuit 108 includes fail address processing circuit 140 and fail detection circuit 142. Fail address processing circuit 140 is electrically coupled to fail detection circuit 142 via pass/fail communications path 144.

Fail address processing circuit 140 is electrically coupled to the four sets of volatile storage elements 102a-102d via volatile storage communications path 146 and to the four sets of non-volatile storage elements 104a-104d via non-volatile storage communications path 148. Fail address processing circuit 140 is also electrically coupled to the four sets of volatile storage elements 102a-102d via master bit communications path 150, row address communications path 152, and column address communications path 154. The four sets of volatile storage elements 102a-102d are electrically coupled to non-volatile storage elements 104a-104d via storage element communications path 164.

Fail detection circuit 142 receives expected data at 156 from a tester, such as tester 24, controller 110 or a BIST circuit in memory device 22. Fail detection circuit 142 receives read data at 158 from the banks of memory cells 100a-100d and compares the read data at 158 to expected data at 156 to detect and identify defective memory cells. Fail detection circuit 142 provides pass/fail signals via pass/fail communications path 144 based on the comparison results. If the read data at 158 matches the expected data at 156, fail detection circuit 142 provides a pass signal in the pass/fail signals at 144. If the read data at 158 does not match the expected data at 156, fail detection circuit 142 provides a fail signal in the pass/fail signals at 144.

Fail address processing circuit 140 receives addresses at 160 from controller 110 or a BIST circuit in memory device 22. The addresses at 160 indicate the locations of memory cells 34 tested in the banks of memory cells 100a-100d. Fail address processing circuit 140 receives the pass/fail signals via pass/fail communications path 144 and captures the addresses of failing or defective memory cells in response to fail signals in the pass/fail signals at 144.

Fail address processing circuit 140 retrieves previously repaired addresses and addresses of defective memory cells already stored in the four sets of volatile storage elements 102a-102d. Fail address processing circuit 140 compares the newly captured defective memory cell addresses to the previously repaired addresses and the stored defective memory cell addresses. If a newly captured defective memory cell address matches a previously repaired address or one of the stored defective memory cell addresses, the captured defective memory cell address is not stored a second time. If a newly captured defective memory cell address does not match a previously repaired address or one of the stored defective memory cell addresses, the captured defective memory cell address is stored into the corresponding set of volatile storage elements 102a-102d.

To retrieve stored defective memory cell addresses from the sets of volatile storage elements 102a-102d, fail address processing circuit 140 checks the volatile storage master bits M0-Mn in the set of volatile storage elements 102a-102d that corresponds to the bank of memory cells 100a-100d that includes the defective memory cell. If one of the volatile storage master bits M0-Mn is set, fail address processing circuit 140 retrieves the row address and the column address that follows the set volatile storage master bit and compares the newly captured defective memory cell address to the retrieved defective memory cell address. If the captured defective memory cell address matches the retrieved defective memory cell address, the captured defective memory cell address is not stored a second time. If the captured defective memory cell address does not match any of the previously repaired addresses or stored defective memory cell addresses, the captured defective memory cell address is stored into the corresponding set of volatile storage elements 102a-102d at the next available volatile storage master bit Mi.

If all of the volatile storage master bits M0-Mn in one of the sets of volatile storage elements 102a-102d are set or programmed, fail address processing circuit 140 provides a repair status flag at 162 that indicates all of the volatile storage master bits M0-Mn in one of the sets of volatile storage elements 102a-102d are used or programmed and the maximum number of repairs has been reached for the corresponding bank of memory cells 100a-100d.

Fail address processing circuit 140 provides each non-matching defective memory cell address to the set of volatile storage elements 102a-102d that corresponds to the bank of memory cells 100a-100d that includes the defective memory cell. Controller 110 and fail address processing circuit 140 write the defective memory cell address into the corresponding set of volatile storage elements 102a-102d via volatile storage communications path 146. The next available volatile storage master bit Mi in the corresponding set of volatile storage elements 102a-102d is set or programmed and the row address and column address of the defective memory cell is programmed into the storage elements that follow the volatile storage master bit Mi. To store another non-matching defective memory cell address for the same bank of memory cells 100a-100d, the next available volatile storage master bit Mi+1 in the corresponding set of volatile storage elements 102a-102d is set or programmed and the row address and column address of the defective memory cell is programmed into the storage elements that follow this next volatile storage master bit Mi+1. In one embodiment, since each of the banks of memory cells 100a-100d is electrically coupled to a different one of the sets of volatile storage elements 102a-102d, the bank address is not stored. In one embodiment, bank addresses are stored along with the row address and the column address. In other embodiments, only a row address or a column address is stored with or without a bank address.

The defective memory cell addresses in the four sets of volatile storage elements 102a-102d are programmed into the corresponding sets of non-volatile storage elements 104a-104d. Fail address processing circuit 140 provides a hard coding signal at 148 to program the sets of non-volatile storage elements 104a-104d. Each of the sets of non-volatile storage elements 104a-104d is programmed via the corresponding set of volatile storage elements 102a-102d. Non-volatile storage master bits M0-Mn and row and column addresses are programmed into each set of non-volatile storage elements 104a-104d based on the volatile storage master bits M0-Mn and row and column addresses in the corresponding set of volatile storage element 102a-102d. In a first memory repair test via test circuit 108, all volatile storage master bits M0-Mn and row and column addresses in the four sets of volatile storage elements 102a-102d are programmed into the corresponding four sets of non-volatile storage elements 104a-104d. In subsequent memory repair tests, previously programmed non-volatile storage master bits M0-Mn and row and column addresses are not programmed a second time into the sets of non-volatile storage elements 104a-104d.

In one embodiment, the volatile storage master bits M0-Mn and row and column addresses of previously programmed defective memory cell addresses are grayed out or zeroed out of the sets of volatile storage elements 102a-102d and the remaining volatile storage master bits M0-Mn and row and column addresses in the sets of volatile storage elements 102a-102d are programmed into the sets of non-volatile storage elements 104a-104d. Graying out or zeroing out volatile storage master bits M0-Mn and row and column addresses of previously programmed defective memory cell addresses in the sets of volatile storage elements 102a-102d indicates not to program them into the corresponding non-volatile storage elements 104a-104d.

The stored row and column addresses are used to identify and replace defective memory cells with redundant memory cells 106. In other embodiments, the stored addresses are used to identify and replace defective memory cells with one or more of redundant memory cells 106, redundant memory cells external to the four banks of memory cells 100a-100d and/or alternative memory cells from an alternative memory.

In normal operation, controller 110 receives a command and an address and compares the address to addresses of defective memory cells stored in the four sets of non-volatile storage elements 104a-104d. In one embodiment, controller 110 accesses the set of non-volatile storage elements 104a-104d corresponding to the addressed bank of memory cells 100a-100d and checks the non-volatile storage master bits M0-Mn. If one of the non-volatile storage master bits M0-Mn is set, controller 110 accesses the row address and the column address that follows the set non-volatile storage master bit and compares it to the incoming address.

If the incoming address does not match any of the addresses of the defective memory cells stored in the non-volatile storage elements 104a-104d, controller 110 provides control signals and addresses to the four banks of memory cells 100a-100d to read data from or write data into the four banks of memory cells 100a-100d. Data read from the four banks of memory cells 100a-100d is provided to data I/O circuit 112, which provides the data to DQ pads at 126. Data written into the four banks of memory cells 100a-100d is received from data I/O circuit 112 that receives the write data via DQ pads at 126.

If the incoming address matches one of the addresses of defective memory cells stored in the non-volatile storage elements 104a-104d, controller 110 provides control signals and corresponding redundant memory cell addresses to the four banks of memory cells 100a-100d to read data from or write data into the redundant memory cells 106. Data read from redundant memory cells 106 is provided to data I/O circuit 112, which provides the data to DQ pads at 126. Data written into redundant memory cells 106 is received from data I/O circuit 112 that receives the write data via DQ pads at 126.

In a first repair test operation via test circuit 108, fail detection circuit 142 compares read data at 158 to expected data at 156 and provides pass/fail signals based on the comparison results. If the read data at 158 matches the expected data at 156, fail detection circuit 142 provides a pass signal. If the read data at 158 does not match the expected data at 156, fail detection circuit 142 provides a fail signal.

Fail address processing circuit 140 receives the pass/fail signals and captures the addresses of defective memory cells. Fail address processing circuit 140 compares newly captured defective memory cell addresses to previously repaired addresses and to defective memory cell addresses already stored in the four sets of volatile storage elements 102a-102d. If a newly captured defective memory cell address matches a previously repaired address or one of the stored defective memory cell addresses, the captured defective memory cell address is not stored a second time. If a newly captured defective memory cell address does not match any of the previously repaired addresses or stored defective memory cell addresses, the captured defective memory cell address is stored into the corresponding set of volatile storage elements 102a-102d.

Controller 110 and fail address processing circuit 140 write non-matching addresses of defective memory cells into first entries in the sets of volatile storage elements 102a-102d. Fail address processing circuit 140 provides each non-matching defective memory cell address to the set of volatile storage elements 102a-102d that corresponds to the bank of memory cells 100a-100d that includes the defective memory cell. Controller 110 and fail address processing circuit 140 write the address of the defective memory cell into the corresponding set of volatile storage elements 102a-102d at the first available volatile storage master bit Mi. The next non-matching defective memory cell address for the same bank of memory cells 100a-100d is written at the next available volatile storage master bit Mi+1, and so on.

The defective memory cell addresses in the four sets of volatile storage elements 102a-102d, i.e. first entries, are programmed into entries in the corresponding sets of non-volatile storage elements 104a-104d. Fail address processing circuit 140 provides a hard coding signal at 148 to program the sets of non-volatile storage elements 104a-104d. Each of the sets of non-volatile storage elements 104a-104d is programmed via the corresponding set of volatile storage elements 102a-102d. All written volatile storage master bits M0-Mn and row and column addresses in the four sets of volatile storage elements 102a-102d are programmed into the corresponding sets of non-volatile storage elements 104a-104d. The addresses of the defective memory cells are maintained in the sets of non-volatile storage elements 104a-104d even if memory device 22 is powered down.

In subsequent repair tests via test circuit 108, fail address processing circuit 140 senses the addresses of the defective memory cells from the four sets of non-volatile storage elements 104a-104d to obtain sensed addresses. These sensed defective memory cell addresses were previously stored in first entries in the sets of volatile storage elements 102a-102d and then programmed into third entries in the sets of non-volatile storage elements 104a-1104d. In one embodiment, the sensed addresses are restored into first entries in the corresponding four sets of volatile storage elements 102a-102d. In one embodiment, the sensed addresses are stored in other volatile storage elements.

Fail detection circuit 142 compares read data at 158 to expected data at 156 and provides pass/fail signals based on the comparison results. If the read data at 158 matches the expected data at 156, fail detection circuit 142 provides a pass signal. If the read data at 158 does not match the expected data at 156, fail detection circuit 142 provides a fail signal.

Fail address processing circuit 140 receives the pass/fail signals and captures the addresses of defective memory cells. Fail address processing circuit 140 compares newly captured defective memory cell addresses to previously repaired addresses, including sensed addresses and addresses repaired via laser-blown fuses, and to defective memory cell addresses already stored in the four sets of volatile storage elements 102a-102d. If a newly captured defective memory cell address matches a previously repaired address or one of the stored defective memory cell addresses, the captured defective memory cell address is not stored a second time. If a newly captured defective memory cell address does not match any of the previously repaired addresses or stored defective memory cell addresses, the captured defective memory cell address is stored into the corresponding set of volatile storage elements 102a-102d.

Controller 110 and fail address processing circuit 140 write non-matching defective memory cell addresses into second entries in the sets of volatile storage elements 102a-102d, where the second entries do not physically overlap the first entries. Fail address processing circuit 140 provides each non-matching defective memory cell address to the set of volatile storage elements 102a-102d that corresponds to the bank of memory cells 100a-100d that includes the defective memory cell. Controller 110 and fail address processing circuit 140 write the defective memory cell address into the corresponding set of volatile storage elements 102a-102d at the volatile storage master bit Mi that follows previously used first entries. The next non-matching defective memory cell address for the same bank of memory cells 100a-100d is written at the next available volatile storage master bit Mi+1, and so on.

The defective memory cell addresses in the four sets of volatile storage elements 102a-102d, i.e. second entries, are programmed into entries in the corresponding sets of non-volatile storage elements 104a-104d. Fail address processing circuit 140 provides a hard coding signal at 148 to program the sets of non-volatile storage elements 104a-104d. Each of the sets of non-volatile storage elements 104a-104d is programmed via the corresponding set of volatile storage elements 102a-102d. Previously programmed non-volatile storage master bits M0-Mn and row and column addresses are not programmed a second time into the sets of non-volatile storage elements 104a-104d. In one embodiment, the volatile storage master bits M0-Mn and row and column addresses of previously programmed defective memory cell addresses, i.e. first entries, are grayed out or zeroed out of the sets of volatile storage elements 102a-102d and the remaining volatile storage master bits Mi-Mn and row and column addresses in the sets of volatile storage elements 102a-102d are programmed into the sets of non-volatile storage elements 104a-104d.

The row and column addresses are maintained in the sets of non-volatile storage elements 104a-104d even if memory device 22 is powered down. The stored row and column addresses are used to identify and replace defective memory cells with redundant memory cells 106. In other embodiments, the stored addresses are used to identify and replace defective memory cells with one or more of redundant memory cells 106, redundant memory cells external to the four banks of memory cells 100a-100d and/or alternative memory cells from an alternative memory.

Figure 4:
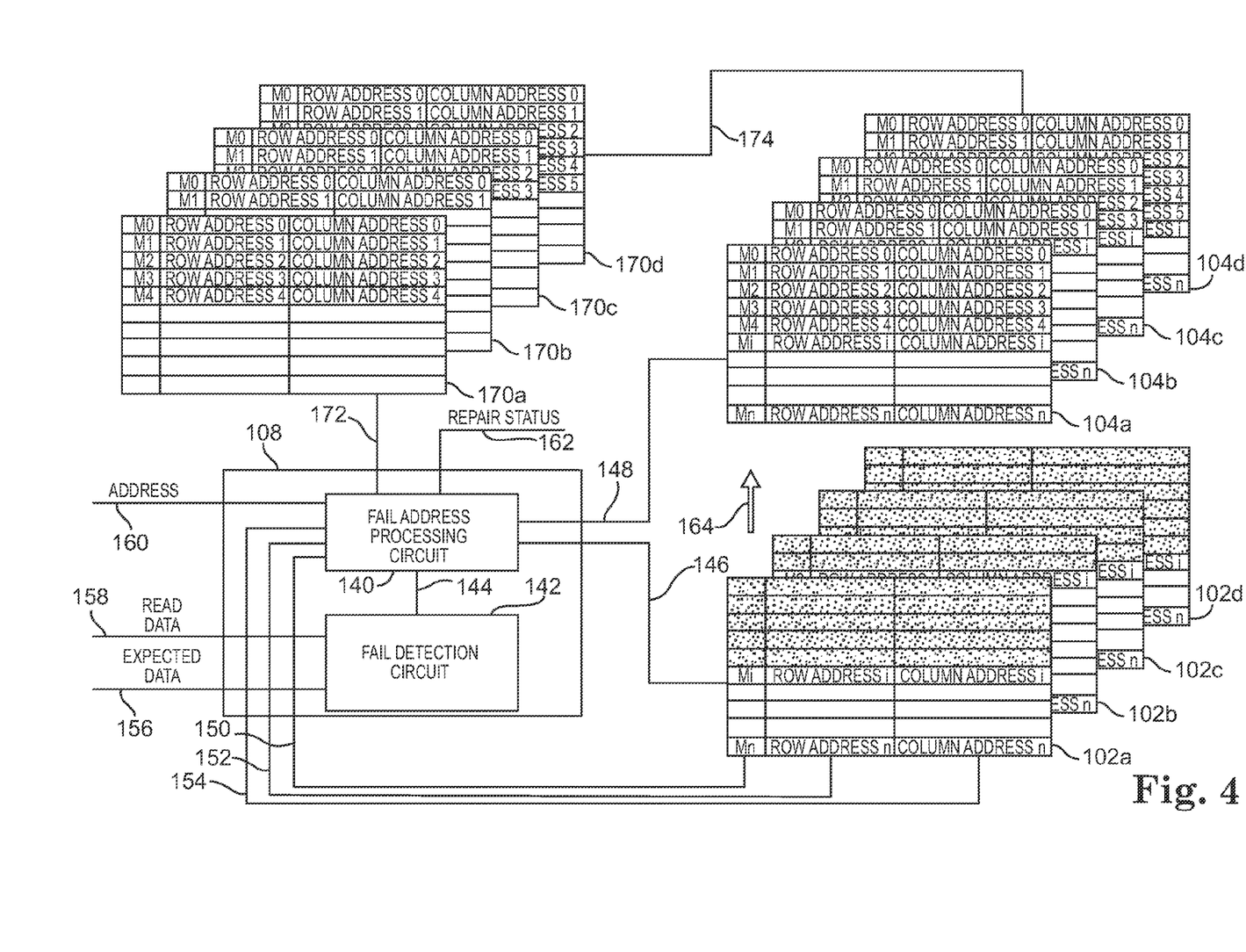
FIG. 4 is a diagram illustrating one embodiment of a test circuit, four sets of volatile storage elements, four sets of non-volatile storage elements and four sets of temporary volatile storage elements.

FIG. 4 is a diagram illustrating one embodiment of test circuit 108, the four sets of volatile storage elements 102a-102d, the four sets of non-volatile storage elements 104a-104d and four sets of temporary volatile storage elements 170a-170d that are used in subsequent memory repair tests. Test circuit 108 includes fail address processing circuit 140 and fail detection circuit 142, where fail address processing circuit 140 is electrically coupled to fail detection circuit 142 via pass/fail communications path 144. Test circuit 108, fail address processing circuit 140, fail detection circuit 142, the four sets of volatile storage elements 102a-102d and the four sets of non-volatile storage elements 104a-104d are the same as described above.

Fail address processing circuit 140 is electrically coupled to the four sets of volatile storage elements 102a-102d via volatile storage communications path 146 and to the four sets of non-volatile storage elements 104a-104d via non-volatile storage communications path 148. Fail address processing circuit 140 is also electrically coupled to the four sets of volatile storage elements 102a-102d via master bit communications path 150, row address communications path 152, and column address communications path 154. The four sets of volatile storage elements 102a-102d are electrically coupled to the four sets of non-volatile storage elements 104a-104d via storage element communications path 164. In addition, fail address processing circuit 140 is electrically coupled to the four sets of temporary volatile storage elements 170a-170d via temporary storage communications path 172, and the four sets of non-volatile storage elements 104a-104d are electrically coupled to the four sets of temporary volatile storage elements 170a-170d via retrieval communications path 174.

In this example second repair test, fail address processing circuit 140 senses the addresses of defective memory cells from the four sets of non-volatile storage elements 104a-104d to obtain the sensed addresses. The sensed addresses were previously stored in first entries in the sets of volatile storage elements 102a-102d and programmed into third entries in the sets of non-volatile storage elements 104a-104d. Fail address processing circuit 140 writes the sensed addresses into the four sets of temporary volatile storage elements 170a-170d. In other embodiments, fail address processing circuit 140 restores the sensed addresses into first entries in the corresponding four sets of volatile storage elements 102a-102d.

The four sets of temporary volatile storage elements 170a-170d correspond to the four sets of non-volatile storage elements 104a-104d. The set of temporary volatile storage elements 170a corresponds to the set of non-volatile storage elements 104a. The set of temporary volatile storage elements 170b corresponds to the set of non-volatile storage elements 104b. The set of temporary volatile storage elements 170c corresponds to the set of non-volatile storage elements 104c, and the set of temporary volatile storage elements 170d corresponds to the set of non-volatile storage elements 104d.

Non-volatile storage master bits M0-M4 and the row and column addresses that follow are sensed from non-volatile storage elements 104a and written into temporary volatile storage elements 170a via retrieval communications path 174. Non-volatile storage master bits M0-M1 and the row and column addresses that follow are sensed from non-volatile storage elements 104b and written into temporary volatile storage elements 170b via retrieval communications path 174. Non-volatile storage master bits M0-M3 and the row and column addresses that follow are sensed from non-volatile storage elements 104c and written into temporary volatile storage elements 170c via retrieval communications path 174, and non-volatile storage master bits M0-M5 and the row and column addresses that follow are sensed from non-volatile storage elements 104d and written into temporary volatile storage elements 170d via retrieval communications path 174.

Fail detection circuit 142 compares read data at 158 to expected data at 156 and provides pass/fail signals based on the comparison results. If the read data at 158 matches the expected data at 156, fail detection circuit 142 provides a pass signal. If the read data at 158 does not match the expected data at 156, fail detection circuit 142 provides a fail signal.

Fail address processing circuit 140 receives the pass/fail signals and captures the addresses of defective memory cells. Fail address processing circuit 140 accesses the sensed addresses in the four sets of temporary volatile storage elements 170a-170d via temporary storage communications path 172 and compares the newly captured defective memory cell addresses to previously repaired addresses, including the sensed addresses and addresses repaired via laser-blown fuses, and to defective memory cell addresses already stored in the four sets of volatile storage elements 102a-102d. If a newly captured defective memory cell address matches a previously repaired address or one of the stored defective memory cell addresses, the captured defective memory cell address is not stored a second time. If a newly captured defective memory cell address does not match any of the previously repaired addresses or stored defective memory cell addresses, the captured defective memory cell address is stored into the corresponding set of volatile storage elements 102a-102d.

Controller 110 and fail address processing circuit 140 write non-matching defective memory cell addresses into second entries in the sets of volatile storage elements 102a-102d, where the second entries do not physically overlap the first entries. Fail address processing circuit 140 provides each non-matching defective memory cell address to the set of volatile storage elements 102a-102d that corresponds to the bank of memory cells 100a-100d that includes the defective memory cell. Controller 110 and fail address processing circuit 140 write the defective memory cell address into the corresponding set of volatile storage elements 102a-102d at the next available volatile storage master bit Mi, which follows the previously used first entries. The next non-matching defective memory cell address for the same bank of memory cells 100a-100d is written at the next available volatile storage master bit Mi+1, and so on.

If all of the volatile storage master bits M0-Mn in one of the sets of volatile storage elements 102a-102d are set or programmed, fail address processing circuit 140 provides a repair status flag at 162 that indicates all of the volatile storage master bits M0-Mn in one of the sets of volatile storage elements 102a-102d are used or programmed and the maximum number of repairs has been reached for the corresponding bank of memory cells 100a-100d.

The previously used first entries in the four sets of volatile storage elements 102a-102d, including volatile storage master bits M0-Mi−1 and the row and column addresses that follow, are grayed out or zeroed out of the sets of volatile storage elements 102a-102d. The second entries in the four sets of volatile storage elements 102a-102d, including the remaining volatile storage master bits Mi-Mn and the row and column addresses that follow in the sets of volatile storage elements 102a-102d are programmed into fourth entries in the corresponding sets of non-volatile storage elements 104a-104d. Fail address processing circuit 140 provides a hard coding signal at 148 to program the sets of non-volatile storage elements 104a-104d and each of the sets of non-volatile storage elements 104a-104d is programmed via the corresponding set of volatile storage elements 102a-102d, where previously programmed non-volatile storage master bits M0-Mi−1 and row and column addresses are not programmed a second time into the sets of non-volatile storage elements 104a-104d.

The row and column addresses are maintained in the sets of non-volatile storage elements 104a-104d even if memory device 22 is powered down. The stored row and column addresses are used to identify and replace defective memory cells with redundant memory cells 106. In other embodiments, the stored addresses are used to identify and replace defective memory cells with one or more of redundant memory cells 106, redundant memory cells external to the four banks of memory cells 100a-100d and/or alternative memory cells from an alternative memory.

Figure 5:
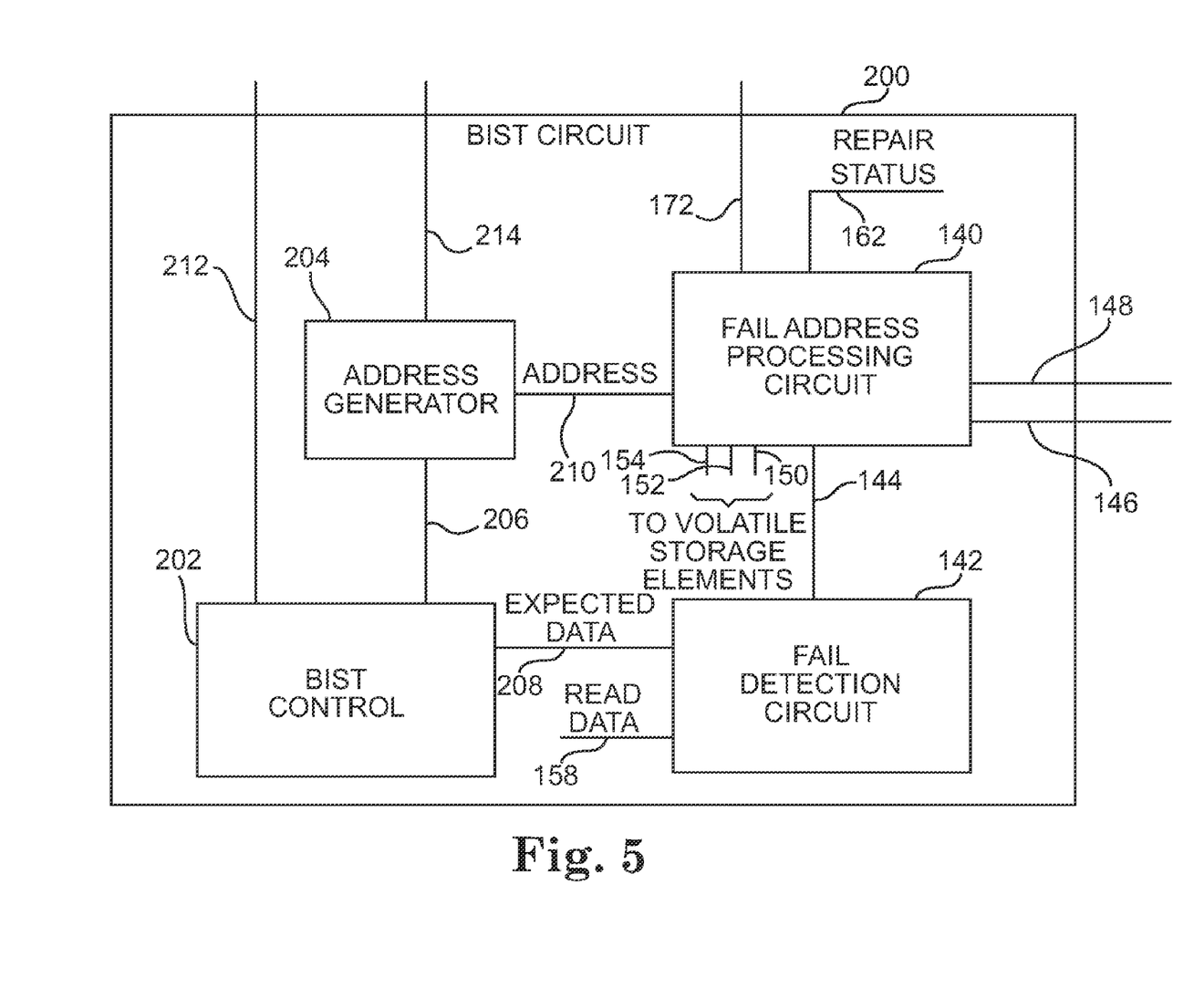
FIG. 5 is a diagram illustrating one embodiment of a built-in-self-test (BIST) circuit in a memory device.

FIG. 5 is a diagram illustrating one embodiment of a BIST circuit 200 in a memory device 22. BIST circuit 200 includes fail address processing circuit 140 and fail detection circuit 142. BIST circuit 200 also includes a BIST control circuit 202 and an address generator 204. BIST circuit 200 tests and detects failures in the four banks of memory cells 100a-100d. The failures can be hard failures, such as stuck-at-one or stuck-at-zero failures, insufficient data retention times, or other failures that prevent the device from operating efficiently.

BIST control circuit 202 is electrically coupled to address generator 204 via address generator communications path 206 and to fail detection circuit 142 via expected data path 208. Fail detection circuit 142 is electrically coupled to fail address processing circuit 140 via pass/fail communications path 144 and address generator 204 is electrically coupled to fail address processing circuit 140 via address communications path 210.

BIST control circuit 202 receives a control signal from a controller, such as controller 110 (shown in FIG. 2), via BIST circuit communications path 212. In response to the control signal at 212, BIST circuit 200 begins testing the four banks of memory cells 100a-100d.

BIST control circuit 202 provides an address generation signal that is received by address generator 204 via address generator communications path 206. In response to the address generation signal at 206, address generator 204 provides addresses to the controller and the four banks of memory cells 100a-100d via memory address path 214. BIST control circuit 202 also provides write data at 212 to the controller to write into the four banks of memory cells 100a-100d.

Fail detection circuit 142 receives expected data results from BIST control circuit 202 via expected data path 208 and read data at 158 from the four banks of memory cells 100a-100d. Fail detection circuit 142 compares the expected data at 208 to the read data at 158 and obtains failure results. If a failure is detected, fail detection circuit 142 indicates the failure to fail address processing circuit 140 in the pass/fail signal at 144. Fail address processing circuit 140 receives the pass/fail signal at 144 and addresses from address generator 204 via address communications path 210 and captures the addresses of defective memory cells. Fail address processing circuit 140 and fail detection circuit 142 operate as described above to provide a first repair test and subsequent repair tests.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated circuit, comprising:
an array of memory cells;
volatile storage;
non-volatile storage; and
a circuit configured to sense first addresses of first defective memory cells from the non-volatile storage to obtain sensed first addresses, wherein the circuit detects second defective memory cells via the sensed first addresses and stores second addresses of the second defective memory cells in the volatile storage and the non-volatile storage.

2. The integrated circuit of claim 1, wherein the first addresses are stored in first entries in the volatile storage and the second addresses are stored in second entries in the volatile storage, which are different than the first entries in the volatile storage.

3. The integrated circuit of claim 2, wherein the sensed first addresses are stored in the first entries in the volatile storage.

4. The integrated circuit of claim 2, wherein the first entries are grayed out prior to storing the second addresses in the non-volatile storage.

5. The integrated circuit of claim 2, wherein the first addresses are stored in third entries in the non-volatile storage and the second addresses are stored in fourth entries in the non-volatile storage, which are different than the third entries in the non-volatile storage.

6. The integrated circuit of claim 5, wherein the first entries correspond to the third entries and the second entries correspond to the fourth entries.

7. The integrated circuit of claim 5, wherein the second addresses are stored in the non-volatile storage via the volatile storage and the second entries correspond to the fourth entries.

8. The integrated circuit of claim 1, wherein the array of memory cells includes banks of memory cells and the volatile storage includes sets of volatile storage elements and each of the banks of memory cells is electrically coupled to a different one of the sets of volatile storage elements.

9. The integrated circuit of claim 8, wherein the non-volatile storage includes sets of non-volatile storage elements and each of the sets of non-volatile storage elements corresponds to a different one of the banks of memory cells.

10. The integrated circuit of claim 8, wherein the circuit provides a repair status flag that indicates one of the sets of volatile storage elements is full.

11. A memory device, comprising:
an array of memory cells;
volatile storage;
non-volatile storage; and
a circuit configured to detect first defective memory cells and store first addresses of the first defective memory cells in the volatile storage and the non-volatile storage, wherein the circuit senses the first addresses stored in the non-volatile storage to obtain sensed first addresses, detects second defective memory cells via the sensed first addresses and stores second addresses of the second defective memory cells in the volatile storage and the non-volatile storage.

12. The memory device of claim 11, wherein the first addresses are stored in first entries in the volatile storage and the second addresses are stored in second entries in the volatile storage, which are different than the first entries in the volatile storage.

13. The memory device of claim 12, wherein the first entries are grayed out prior to programming the second addresses into the non-volatile storage via the volatile storage.

14. The memory device of claim 12, wherein the sensed first addresses are stored in the first entries in the volatile storage.

15. An integrated circuit, comprising:
an array of memory cells;
means for temporarily storing first addresses of first defective memory cells and second addresses of second defective memory cells;
means for non-temporarily storing the first addresses and the second addresses;
means for sensing the first addresses from the means for non-temporarily storing to obtain sensed first addresses;
means for detecting the second defective memory cells via the sensed first addresses; and
means for storing the second addresses in the means for temporarily storing and the means for non-temporarily storing.

16. The integrated circuit of claim 15, wherein the means for temporarily storing first addresses of first defective memory cells and second addresses of second defective memory cells includes:
means for temporarily storing the first addresses in first entries; and
means for temporarily storing the second addresses in second entries that are different than the first entries.

17. The integrated circuit of claim 16, wherein the means for temporarily storing first addresses of first defective memory cells and second addresses of second defective memory cells includes:

means for temporarily storing the sensed first addresses in the first entries.

18. The integrated circuit of claim 16, comprising:
means for graying out the first entries prior to storing the second addresses in the means for non-temporarily storing.

19. A method of repairing a memory, comprising:
sensing first addresses of first defective memory cells from non-volatile storage to obtain sensed first addresses;
detecting second defective memory cells via the sensed first addresses;
storing second addresses of the second defective memory cells in volatile storage; and
storing the second addresses in non-volatile storage via the volatile storage.

20. The method of claim 19, comprising:
storing the first addresses of the first defective memory cells in first entries of the volatile storage, wherein storing second addresses of the second defective memory cells in volatile storage comprises:
storing the second addresses of the second defective memory cells in second entries of the volatile storage, which are different than the first entries of the volatile storage.

21. The method of claim 20, comprising:
storing the sensed first addresses in the first entries of the volatile storage.

22. The method of claim 20, comprising:
graying out the first entries prior to storing the second addresses in the non-volatile storage via the volatile storage.

23. A method of repairing a memory, comprising:
detecting first defective memory cells;
storing first addresses of the first defective memory cells in volatile storage;
storing the first addresses of the first defective memory cells in non-volatile storage via the volatile storage;
sensing the first addresses from the non-volatile storage to obtain sensed first addresses;
detecting second defective memory cells via the sensed first addresses;
storing second addresses of the second defective memory cells in the volatile storage; and
storing second addresses of the second defective memory cells in the non-volatile storage via the volatile storage.

24. The method of claim 23, wherein:
storing first addresses of the first defective memory cells in volatile storage comprises storing the first addresses in first entries in the volatile storage;
storing second addresses of the second defective memory cells in the volatile storage comprises storing the second addresses in second entries in the volatile storage, which are different than the first entries in the volatile storage;
storing the first addresses of the first defective memory cells in non-volatile storage comprises storing the first addresses in third entries in the non-volatile storage; and
storing second addresses of the second defective memory cells in the non-volatile storage comprises storing the second addresses in fourth entries in the non-volatile storage, which are different than the third entries in the non-volatile storage.

25. The method of claim 24, wherein the first entries correspond to the third entries and the second entries correspond to the fourth entries and comprising:
graying out the first entries prior to storing the second addresses in the fourth entries of the non-volatile storage via the volatile storage.

* * * * *